(12) United States Patent
Ipposhi et al.

(10) Patent No.: US 6,864,534 B2
(45) Date of Patent: Mar. 8, 2005

(54) SEMICONDUCTOR WAFER

(75) Inventors: Takashi Ipposhi, Tokyo (JP); Takuji Matsumoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/930,202

(22) Filed: Aug. 16, 2001

(65) Prior Publication Data

US 2003/0094674 A1 May 22, 2003

(30) Foreign Application Priority Data

Oct. 25, 2000 (JP) ........................................ 2000-325368

(51) Int. Cl.$^7$ .......................... H01L 27/01; H01L 29/00; H01L 29/04
(52) U.S. Cl. ......................... 257/347; 257/627; 257/521; 438/149; 438/479; 438/517
(58) Field of Search ................................. 257/347, 627, 257/521, 622; 438/149, 479, 517

(56) References Cited

U.S. PATENT DOCUMENTS

| | | | | |
|---|---|---|---|---|
| 3,920,492 A | * | 11/1975 | Sugita et al. | 148/175 |
| 5,060,043 A | * | 10/1991 | Yasue | 357/40 |
| 6,174,222 B1 | * | 1/2001 | Sato et al. | 451/44 |

FOREIGN PATENT DOCUMENTS

| | | |
|---|---|---|
| JP | 56060061 | 5/1981 |
| JP | 01241854 | 9/1989 |
| JP | 05090117 | 4/1993 |
| JP | 06005569 | 1/1994 |
| JP | 8-213578 | 8/1996 |
| JP | 9-223667 | 8/1997 |
| JP | 9-246505 | 9/1997 |

OTHER PUBLICATIONS

M. Bruel, et al., ""Smart Cut": A Promising New SOI Material Technology", Proceedings 1995 IEEE International SOI Conference, Oct. 1995, pp. 178–179.

N. Sato et al., "High–Quality Epitaxial Layer Transfer (ELTRAN) by Bond and Etch–Back of Porous Si", Proceedings 1995 IEEE International SOI Conferance, Oct. 1995, pp. 176–177.

K. Ohmi, et al., "Water Jet Splitting of Thin Porous Si for ELTRAN", Extended Abstracts of the 1999 International Conference on Solid State Devices and Materials, Tokyo, 1999, pp. 354–355.

H. Sayama, et al., "Effect of <100> Channel Direction for High Performance SCE Immune pMOSFET with Less Than 0.15 μm Gate Length", 1999 IEEE, IEDM, pp. 657–660.

(List continued on next page.)

*Primary Examiner*—Allan R. Wilson
*Assistant Examiner*—Joseph Nguyen

(57) ABSTRACT

To provide a semiconductor wafer having crystal orientations of a wafer for the support substrate and a wafer for the device formation shifted from each other, wherein two kinds of wafers having different crystal orientations in which a notch or an orientation flat is to be provided do not need to be prepared. One of two semiconductor wafers having a notch or an orientation flat provided in the same crystal orientation <110> is set to be a wafer (1) for the support substrate and the other is set to be a wafer for the device formation. Both wafers are bonded with the notches or orientation flats shifted from each other (for example, a crystal orientation <100> of the wafer for the device formation and the crystal orientation <110> of the wafer (1) for the support substrate are set to the same direction). The wafer for the device formation is divided to obtain an SOI layer (3). A MOS transistor (TR1) or the like is formed on the SOI layer (3).

10 Claims, 11 Drawing Sheets

OTHER PUBLICATIONS

Effect of <100> Channel Direction for High Performance SCE Immune pMOSFET with Less Than 0.15 μm Gate Length, H. Sayama, et al.; International Electron Devices Meeting 1999; IEDM. Technical Digest, Washington, DC; Dec. 5–8, 1999; New York, NY; IEEE US; pp. 657–660.

Smart Cut: A Promising New SOI Material Technology; Bruel, M. et al.; 1995 IEEE International SOI Conference Proceedings; Tuscon, Oct. 3–5, 1995; Proceedings of the Annual SOS/SOI Technology Conference, (From 1991 Proceedings of the International SOI Conference.) Silicon–on–Insulator Technology and Devices, New York, Oct. 3, 1995; pp. 178–179.

High–Quality Epitaxial Layer Transfer (Eltran) by Bond and Etch–Back of Porous Si; Sato, et al.; 1995 IEEE International SOI Conference Proceedings. Tuscon, Oct. 3–5, 1995; Proceedings of the Annual SOS/SOI Technology Conference. (From 1991 Proceedings of the International SOI Conference.) Silicon–On–Insulator Technology and Devices, New York, Oct. 3, 1995, pp. 176–177.

U.S. patent application Ser. No. 09/930,202, Ipposhi et al., filed Aug. 16, 2001.

U.S. patent application Ser. No. 10/406,289, Iwamatsu, filed Apr. 4, 2003.

U.S. patent application Ser. No. 10/461,352, Iwamatsu et al., filed Jun. 16, 2003.

* cited by examiner

F I G. 5
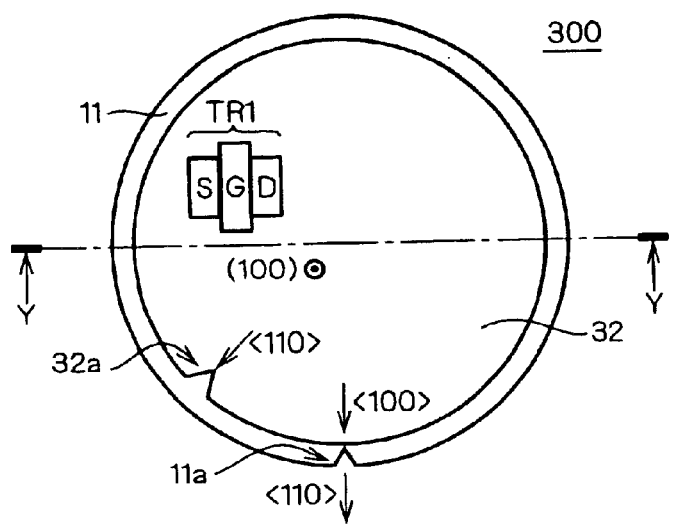
F I G. 6
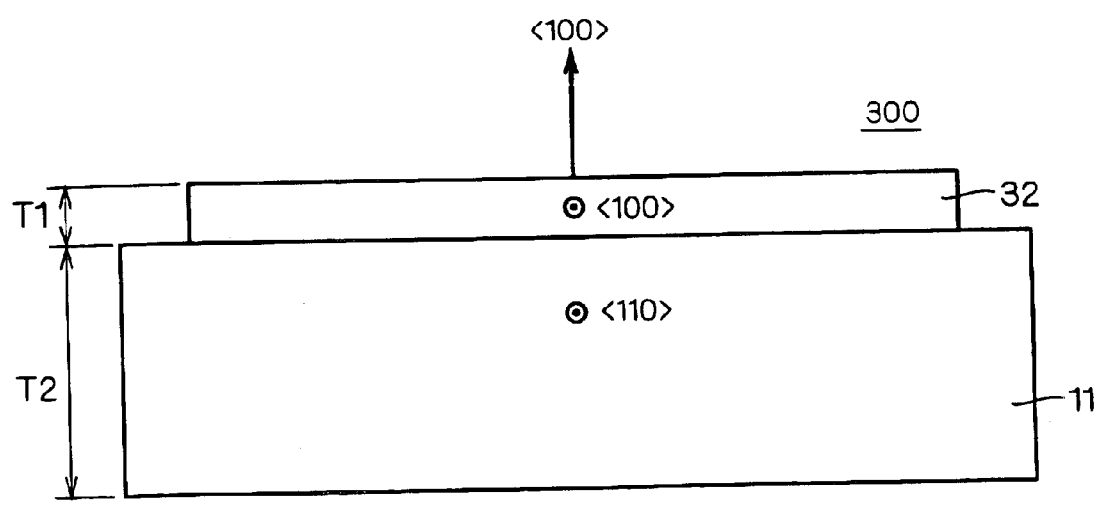

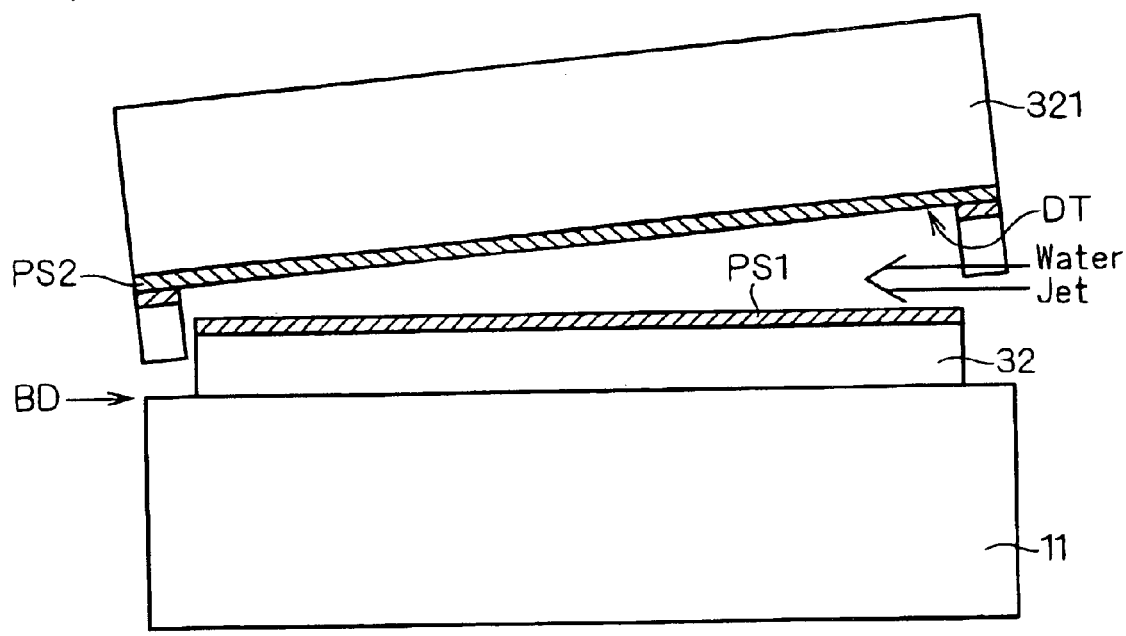
F I G . 1 3
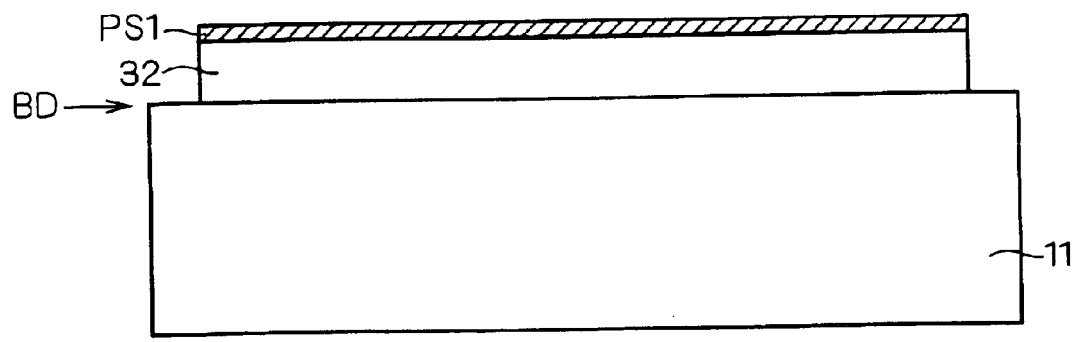
F I G . 1 4

SEMICONDUCTOR WAFER

BACKGROUND OF THE INVENTION

1. Field of the Invention

The present invention relates to a semiconductor wafer having a surface on which an integrated circuit or the like is to be formed.

2. Description of the Background Art

In the case in which an SOI (Silicon On Insulator) wafer is to be manufactured by bonding a wafer for the support substrate and a wafer for an SOI layer, the SMART CUT method, the ELTRAN method or the like is used. (Referring to the SMART CUT method, for example, see "SMART CUT: A PROMISING NEW SOI MATERIAL TECHNOLOGY" M. BRUEL el al., Proceedings 1995 IEEE International SOI Conference, October 1995, pp. 178–179. Referring to the ELTRAN method, for example, see "HIGH—QUALITY EPITAXIAL LAYER TRANSFER (ELTRAN) BY BOND AND ETCH—BACK OF POROUS Si" N. Sato et al., Proceedings 1995 IEEE International SOI Conference, October 1995, pp. 176–177 and "Water Jet Splitting of Thin Porous Si for ELTRAN" K. Ohmi et al., Extended Abstracts of the 1999 International Conference on Solid State Devices and Materials, Tokyo, 1999, pp. 354–355.)

FIG. 17 is a view showing an example of a conventional SOI wafer. An SOI wafer 400 is a (100) wafer having a (100) plane as a main surface. FIG. 18 is a view showing a section taken along a cutting line W—W in FIG. 17.

As shown in FIGS. 17 and 18, an oxide film layer 2 is provided on one main surface of a wafer 1 for the support substrate formed of a silicon substrate, for example, and an SO layer 3 is formed on the oxide film layer 2 in the SOI wafer 400. The SOI layer 3 and the oxide film layer 2 are formed by bonding a wafer for an SOI layer having an oxide film formed on a main surface to the wafer 1 for the support substrate and then removing a part thereof. The SOI layer 3 and the oxide film layer 2 have almost the same diameters. Both diameters might be slightly varied depending on a manufacturing method.

The SOI layer 3 is provided with a semiconductor device including devices such as MOS (Metal Oxide Semiconductor) transistors TR1 and TR2, a wiring for connecting the devices and the like. Notches 1a and 3a are formed in the wafer 1 for the support substrate and the SOI layer 3 in a direction of a crystal orientation <110>, respectively. Moreover, FIG. 17 also shows crystal orientations <100> and <110> in a wafer plane.

In the conventional SOI wafer, generally, a direction of a channel between a source and a drain of a MOS transistor is provided in parallel with the crystal orientation <110>. The MOS transistors TR1 and TR2 in FIG. 17 are taken as an example. In the MOS transistors TR1 and TR2, designations S, D and G denote a source, a drain and a gate, respectively.

With such an arrangement that the channel direction is parallel with the crystal orientation <100>, however, a transistor characteristic can be changed. More specifically, it is known that such an arrangement as to set the channel direction in parallel with the crystal orientation <100> can enhance current driving force of a P channel MOS transistor by approximately 15%, and furthermore, can also reduce a short channel effect. It is supposed that the current driving force is enhanced because of a greater mobility of a hole of the crystal orientation <100> than that of the crystal orientation <110> and also supposed that the short channel effect is reduced because of a smaller diffusion coefficient of boron of the crystal orientation <100> than that of the crystal orientation <110> (see "Effect of <100> Channel Direction for High Performance SCE Immune pMOSFET with Less Than 0.15 $\mu$m Gate Length" H. Sayama et al., IEDM99, pp. 657–660).

In the case in which the channel direction of the MOS transistor is to be provided in parallel with the crystal orientation <100> in the (100) wafer, a direction of the wafer should be rotated by 45 degrees or 135 degrees in order to form a circuit by using a conventional circuit pattern mask, a conventional manufacturing apparatus or the like. In this case, it is desirable that directions of a notch and an orientation flat should be changed from the crystal orientation <110> to the crystal orientation <100> such that a wafer can be exactly applied to the conventional manufacturing apparatus.

However, the simple rotation of the wafer by 45 degrees or 135 degrees hinders the development of a new device in some cases, which will be described below.

In a wafer of a crystal having a diamond structure such as a silicon crystal, a crystal surface {110} or {111} is a cleavage plane. In the case of the (100) wafer, particularly, the crystal surface {110} is the cleavage plane.

In an aspect of the development of a device, a sectional structure of the device formed on a wafer is observed by an electron microscope. In that case, the wafer is often cleaved. If a surface other than the cleavage plane is to be exposed, it is necessary to carry out etching the wafer by using an FIB (Focused Ion Beam) device or the like. Consequently, a great deal of time and labor is required so that a development efficiency is reduced.

When the (100) wafer is simply rotated by 45 degrees or 135 degrees to form, on the surface thereof, a MOS transistor having a channel direction in parallel with the crystal orientation <100>, a structure shown in FIG. 19 is obtained. In FIG. 19, a MOS transistor TR3 is formed on a (100) plane of a wafer 30 on which a notch 30a is provided in a direction of the crystal orientation <100>.

In the case in which the wafer 30 is cleaved, a cleavage plane CL appears in the direction of the crystal orientation <110>. Since the channel direction of the MOS transistor TR3 is provided in parallel with the crystal orientation <100>, a section of the MOS transistor TR3 which is broken obliquely with respect to a direction of a channel or a gate appears. Consequently, the oblique sectional structure to the direction of the channel or the gate is observed, and it is hard to accurately carry out evaluation of a gate width or the like, for example.

Moreover, FIG. 20 shows an example in which a memory cell array device AR having a cell CE such as a memory provided in a matrix is formed on the wafer 30 such that the channel direction is parallel with the crystal orientation <100>. Also in this case, the cleavage plane CL appears in the direction of the crystal orientation <110>. Therefore, the oblique sectional structure to the direction of the channel or the gate is observed. For example, it is hard to accurately evaluate the periodicity of a sectional structure of each cell or the like.

More specifically, if the wafer is simply rotated by 45 degrees or 135 degrees to form the device, it is hard to expose a desirable sectional structure through cleavage. Consequently, the development of a new device is hindered.

Therefore, it is proposed that only a wafer for an SOI layer to be a wafer for the device formation is rotated by 45 degrees and is bonded to a wafer for the support substrate, thereby manufacturing an SOI wafer. As shown in FIG. 21, it is preferable that an SOI wafer 500 should be manufactured by bonding the wafer 30 for an SOI layer of the (100) wafer having the notch 30a in the direction of the crystal orientation <100> to the wafer 1 for the support substrate of the (100) wafer having the notch 1a in the direction of the crystal orientation <110>. Consequently, the wafer can be divided along the cleavage plane of the wafer 1 for the support substrate occupying most of a wafer thickness during the cleavage, and a MOS transistor having a channel direction in parallel with the crystal orientation <100> can be formed.

In this case, the wafer 30 for an SOI layer is provided with the notch 30a in the direction of the crystal orientation <100> and the wafer 1 for the support substrate is provided with the notch 1a in the direction of the crystal orientation <110>. Therefore, it is necessary to prepare two kinds of semiconductor wafers because of a difference in a direction of the notch. Consequently, a manufacturing process is complicated.

SUMMARY OF THE INVENTION

A first aspect of the present invention is directed to a semiconductor wafer comprising first and second semiconductor wafers having crystal orientation display sections to be nicks indicative of crystal orientations formed on fringes thereof, wherein the crystal orientation display sections are indicative of an identical crystal orientation in the first and second semiconductor wafers, and the first and second semiconductor wafers are bonded with the crystal orientation display sections shifted from each other.

A second aspect of the present invention is directed to the semiconductor wafer according to the first aspect of the present invention, wherein both of the first and second semiconductor wafers are (100) wafers in which (100) planes are main surfaces, and the crystal orientation display sections are shifted from each other by 45 degrees or 135 degrees.

A third aspect of the present invention is directed to the semiconductor wafer according to the second aspect of the present invention, wherein the first semiconductor wafer is a wafer for a support substrate and the second semiconductor wafer is a wafer for a device formation, and a main surface of the wafer for the device formation is provided with a semiconductor device including a MOS transistor in which a channel direction between a source and a drain is parallel with a direction of a crystal orientation <100>.

A fourth aspect of the present invention is directed to a semiconductor wafer comprising a first semiconductor wafer, and a second semiconductor wafer having a crystal orientation display section to be a nick indicative of a crystal orientation formed on a fringe, wherein the first and second semiconductor wafers are bonded to each other such that a part of a main surface of the first semiconductor wafer is exposed to the crystal orientation display section of the second semiconductor wafer, and printing is given to the part of the main surface of the first semiconductor wafer.

A fifth aspect of the present invention is directed to the semiconductor wafer according to the fourth aspect of the present invention, wherein a crystal orientation display section to be a nick indicative of a crystal orientation is also formed on a fringe of the first semiconductor wafer, and the crystal orientation display section of the first semiconductor wafer and the crystal orientation display section of the second semiconductor wafer form an angle of 180 degrees.

A sixth aspect of the present invention is directed to the semiconductor wafer according to the fourth aspect of the present invention, wherein the first semiconductor wafer is a wafer for a support substrate, the second semiconductor wafer is a wafer for an SOI layer, and an insulating film is formed on a main surface of at least one of the wafer for the support substrate and the wafer for the SOI layer.

A seventh aspect of the present invention is directed to a semiconductor wafer comprising first and second semiconductor wafers having bulk structures, wherein the first and second semiconductor wafers are bonded with crystal orientations shifted from each other.

An eighth aspect of the present invention is directed to the semiconductor wafer according to the seventh aspect of the present invention, wherein both of the first and second semiconductor wafers are (100) wafers in which (100) planes are main surfaces, and the crystal orientations are shifted from each other by 45 degrees or 135 degrees.

A ninth aspect of the present invention is directed to the semiconductor wafer according to the eighth aspect of the present invention, wherein the first semiconductor wafer is a wafer for a support substrate and the second semiconductor wafer is a wafer for a device formation, and a main surface of the wafer for the device formation is provided with a semiconductor device including a MOS transistor in which a channel direction between a source and a drain is parallel with a direction of a crystal orientation <100>.

A tenth aspect of the present invention is directed to a method of manufacturing the semiconductor wafer according to the seventh aspect of the present invention, comprising the steps of (a) implanting a hydrogen ion from a main surface of a semiconductor substrate and forming a crystal defect layer in a position having a predetermined depth from the main surface, thereby preparing the second semiconductor wafer, (b) bonding a main surface of the second semiconductor wafer to that of the first semiconductor wafer with crystal orientations of the first and second semiconductor wafers shifted from each other, (c) carrying out a heat treatment on the first and second semiconductor wafers, thereby dividing the second semiconductor wafer through the crystal defect layer, and (d) polishing a portion in the first and second semiconductor wafers where the crystal defect layer is present.

An eleventh aspect of the present invention is directed to a method of manufacturing the semiconductor wafer according to the seventh aspect of the present invention, comprising the steps of (a) forming a porous semiconductor layer and a semiconductor layer on a main surface of a semiconductor substrate, thereby preparing the second semiconductor wafer, (b) bonding the semiconductor layer of the second semiconductor wafer to a main surface of the first semiconductor wafer with crystal orientations of the first and second semiconductor wafers shifted from each other, and (c) removing the semiconductor substrate and the porous semiconductor layer.

A twelfth aspect of the present invention is directed to an apparatus for manufacturing the semiconductor wafer according to the first aspect of the present invention, comprising a support base provided with a concave portion where the first semiconductor wafer is to be mounted, and a guide member provided on the support base surrounding the concave portion which is to be used as an alignment guide of the second semiconductor wafer when the first and second semiconductor wafers are to be bonded, wherein a fringe of the concave portion is provided with a convex portion to abut on the crystal orientation display section of the first semiconductor wafer, the guide member is provided with a movable convex portion capable of abutting on the crystal orientation display section of the second semiconductor wafer, and a position of the convex portion formed on the fringe of the concave portion and that of the convex portion provided in the guide member are shifted from each other by a predetermined angle.

According to the first aspect of the present invention, the first and second semiconductor wafers are bonded with the crystal orientation display sections shifted from each other. Therefore, one of the two semiconductor wafers having the crystal orientation display sections provided in the same crystal orientation is set to be the wafer for the support substrate and the other is set to be the wafer for the device formation. Thus, the crystal orientations of the wafer for the support substrate and the wafer for the device formation can be varied. Accordingly, it is not necessary to prepare two kinds of semiconductor wafers having different crystal orientations in which the crystal orientation display sections are to be provided.

According to the second aspect of the present invention, both of the first and second semiconductor wafers are (100) wafers and the crystal orientation display sections are shifted from each other by 45 degrees or 135 degrees. Therefore, when one of the first and second semiconductor wafers is set to be the wafer for the support substrate and the other is set to be the wafer for the device formation, a crystal surface {100} of the wafer for the device formation can be exposed with cleavage along a crystal surface {110} to be a cleavage plane of the wafer for the support substrate.

According to the third aspect of the present invention, the main surface of the wafer for the device formation is provided with the semiconductor device including the MOS transistor having the channel direction between the source and the drain in parallel with the direction of the crystal orientation <100>. Therefore, when the cleavage is carried out along the crystal surface {110} to be the cleavage plane of the wafer for the support substrate, the crystal surface {100} of the wafer for the device formation can be exposed to see a sectional structure of the semiconductor device including the MOS transistor perpendicularly to or in parallel with the direction of a channel or a gate. Consequently, it is possible to accurately carry out evaluation of a gate width or the like, for example.

According to the fourth aspect of the present invention, printing is given to the portion in the main surface of the first semiconductor wafer which is exposed to the crystal orientation display section of the second semiconductor wafer. Therefore, when the semiconductor wafer is observed from the surface of the second semiconductor wafer, the printing can be seen and the semiconductor wafer can be distinguished easily. Moreover, it is possible to effectively utilize, as a printing space, the portion in the main surface of the first semiconductor wafer which is exposed to the crystal orientation display section.

According to the fifth aspect of the present invention, the crystal orientation display section of the first semiconductor wafer and that of the second semiconductor wafer form an angle of 180 degrees. At a step of inspecting a semiconductor wafer or the like, therefore, when a plurality of semiconductor wafers are accommodated in a case with the crystal orientation display section of the first semiconductor wafer aligned on the underside, the printing portion can be seen easily from the outside of the case so that the semiconductor wafers can be distinguished readily.

According to the sixth aspect of the present invention, the semiconductor wafer is the SOI wafer and the printing is given to the portion in the main surface of the wafer for the support substrate which is exposed to the crystal orientation display section of the wafer for the SOI layer. Therefore, there is less possibility that the SOI layer might be peeled when the printing is carried out by a laser.

According to the seventh aspect of the present invention, the first and second semiconductor wafers having bulk structures are bonded with the crystal orientations shifted from each other. Therefore, one of the first and second semiconductor wafers is set to be the wafer for the support substrate and the other is set to be the wafer for the device formation. Thus, the crystal orientations of the wafer for the support substrate and the wafer for the device formation can be varied.

According to the eighth aspect of the present invention, both of the first and second semiconductor wafers are (100) wafers and the crystal orientations are shifted from each other by 45 degrees or 135 degrees. Therefore, when one of the first and second semiconductor wafers is set to be the wafer for the support substrate and the other is set to be the wafer for the device formation, the crystal surface {100} of the wafer for the device formation can be exposed with cleavage along the crystal surface {110} to be the cleavage plane of the wafer for the support substrate.

According to the ninth aspect of the present invention, the main surface of the wafer for the device formation is provided with the semiconductor device including the MOS transistor having the channel direction between the source and the drain in parallel with the direction of the crystal orientation <100>. Therefore, when the cleavage is carried out along the crystal surface {110} to be the cleavage plane of the wafer for the support substrate, the crystal surface {100} of the wafer for the device formation can be exposed to see the sectional structures of the MOS transistor and the semiconductor device including the MOS transistor perpendicularly to or in parallel with the direction of the channel or the gate. Consequently, it is possible to accurately carry out the evaluation of the gate width or the like, for example.

According to the tenth aspect of the present invention, the semiconductor wafer according to the seventh aspect of the present invention can be obtained.

According to the eleventh aspect of the present invention, the semiconductor wafer according to the seventh aspect of the present invention can be obtained.

According to the twelfth aspect of the present invention, the position of the convex portion formed on the fringe of the concave portion and that of the convex portion provided in the guide member are shifted from each other by a predetermined angle. Therefore, the first and second semiconductor wafers can be bonded to each other with the shift having the predetermined angle. Thus, the semiconductor wafer according to the first aspect of the present invention can be obtained.

It is an object of the present invention to provide a semiconductor wafer in which crystal orientations of a wafer for the support substrate and a wafer for the device formation are shifted from each other, wherein two kinds of semiconductor wafers having different crystal orientations in which a notch or an orientation flat is to be provided are not required.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a top view showing a semiconductor wafer according to a second variant of the first embodiment, FIG. 6 is a sectional view showing the semiconductor wafer according to the second variant of the first embodiment, FIGS. 7 to 14 are views showing a step of a method of manufacturing a semiconductor wafer according to a second embodiment.

DESCRIPTION OF THE PREFERRED EMBODIMENTS

<First Embodiment>

The present embodiment implements a semiconductor wafer in which one of two semiconductor wafers having notches or orientation flats provided in the same crystal orientation is set to be a wafer for the support substrate and the other is set to be a wafer for the device formation, and both wafers are bonded with the notches or orientation flats shifted from each other so that it is not necessary to prepare two kinds of semiconductor wafers having different crystal orientations in which notches or orientation flats are to be provided.

Figure 1:
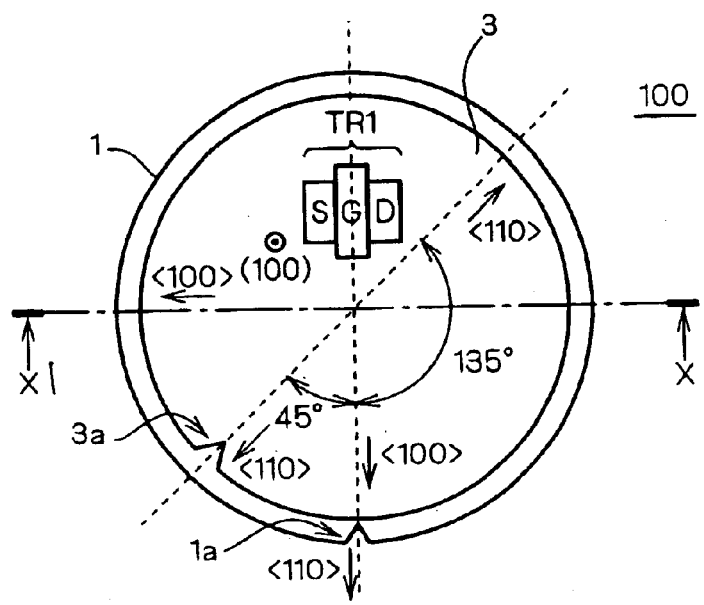
FIG. 1 is a top view showing a semiconductor wafer according to a first embodiment.
Figure 2:
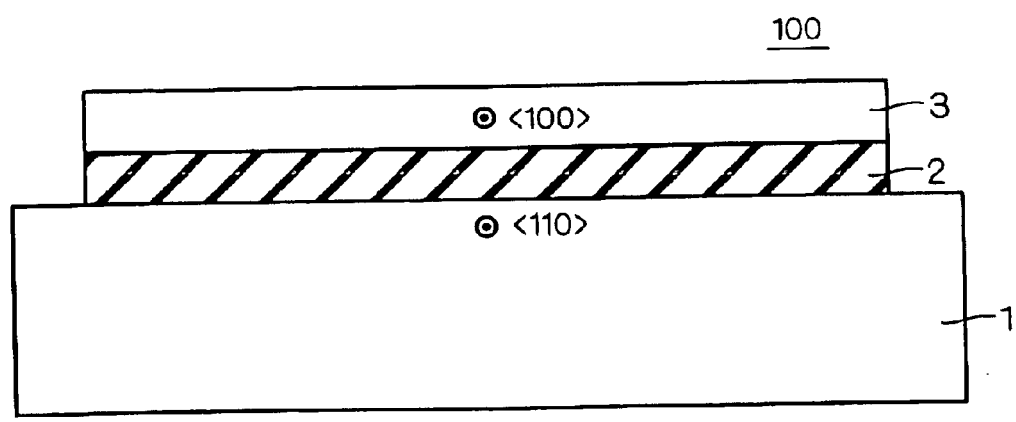
FIG. 2 is a sectional view showing the semiconductor wafer according to the first embodiment.

FIG. 1 is a view showing a semiconductor wafer 100 according to the present embodiment. Moreover, FIG. 2 is a view showing a section taken along a cutting line X—X in FIG. 1.

The semiconductor wafer 100 is an SOI wafer and is a (100) wafer in which a (100) plane is a main surface. In the SOI wafer 100, for example, an oxide film layer 2 is provided on one main surface of a wafer 1 for the support substrate formed of a silicon substrate and an SOI layer 3 is formed on the oxide film layer 2. The SOI layer 3 and the oxide film layer 2 are provided by forming an oxide film on a main surface of a wafer for an SOI layer to be the wafer for the device formation, bonding the wafer for an SOI layer to the wafer 1 for the support substrate and then removing a part thereof. Both the wafer 1 for the support substrate and the wafer for an SOI layer are the (100) wafers. Moreover, the SOI layer 3 and the oxide film layer 2 have almost the same diameters. Both diameters might be slightly varied depending on a manufacturing method.

Notches 1a and 3a are formed in the wafer 1 for the support substrate and the SOI layer 3 in a direction of a crystal orientation <110>, respectively. In the semiconductor wafer 100 according to the present embodiment, however, a position of the notch is shifted by 45 degrees between the wafer 1 for the support substrate and the SOI layer 3 differently from the conventional SOI wafer 400 shown in FIG. 17. More specifically, as shown in FIG. 1, both the notch 1a of the wafer 1 for the support substrate and the notch 3a of the SOI layer 3 are indicative of the same crystal orientation <110> and the wafer 1 for the support substrate and the SOI layer 3 are bonded with the notches shifted from each other by 45 degrees. Thus, the semiconductor wafer 100 is formed.

Figure 17:
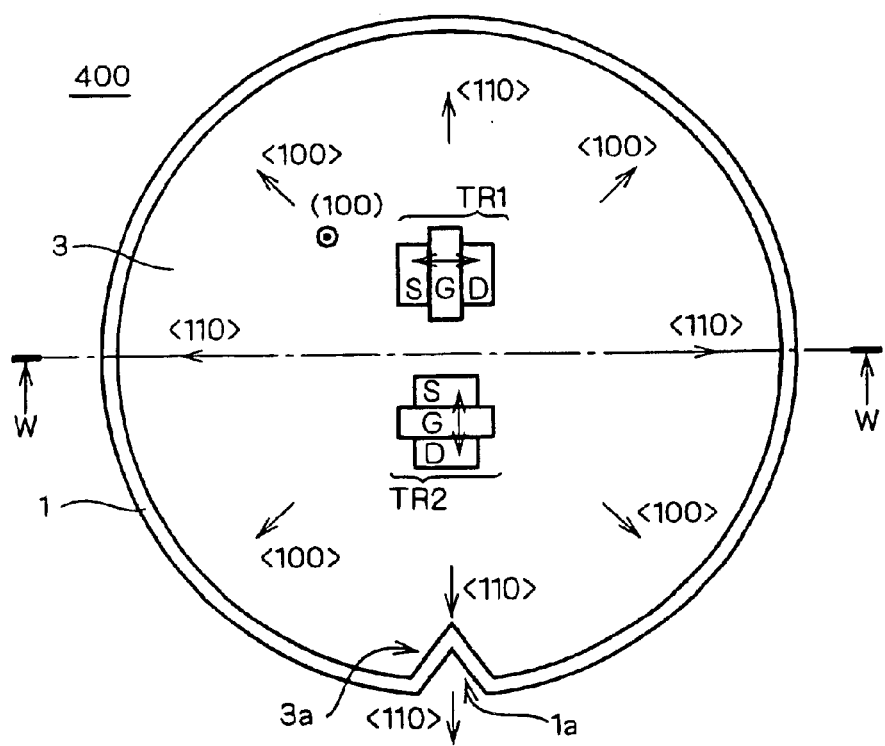
FIG. 17 is a top view showing a conventional semiconductor wafer.
Figure 18:
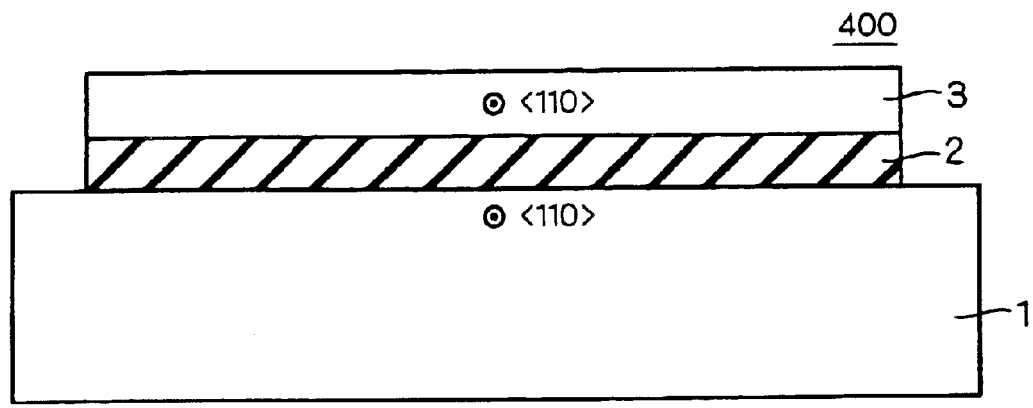
FIG. 18 is a sectional view showing the conventional semiconductor wafer.
Figure 19:
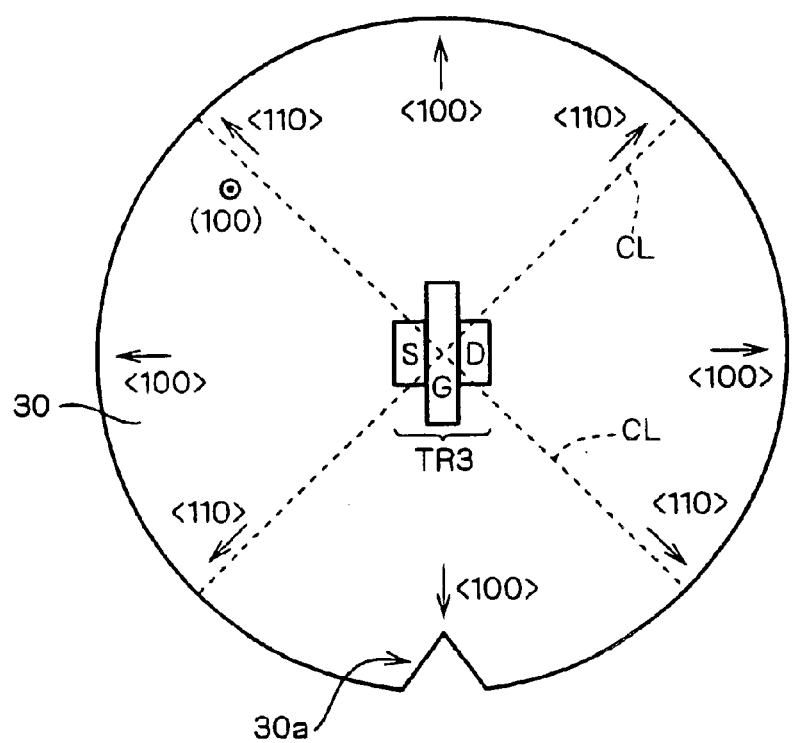
FIGS. 19 to 21 are views showing the drawbacks of the conventional semiconductor wafer.
Figure 20:
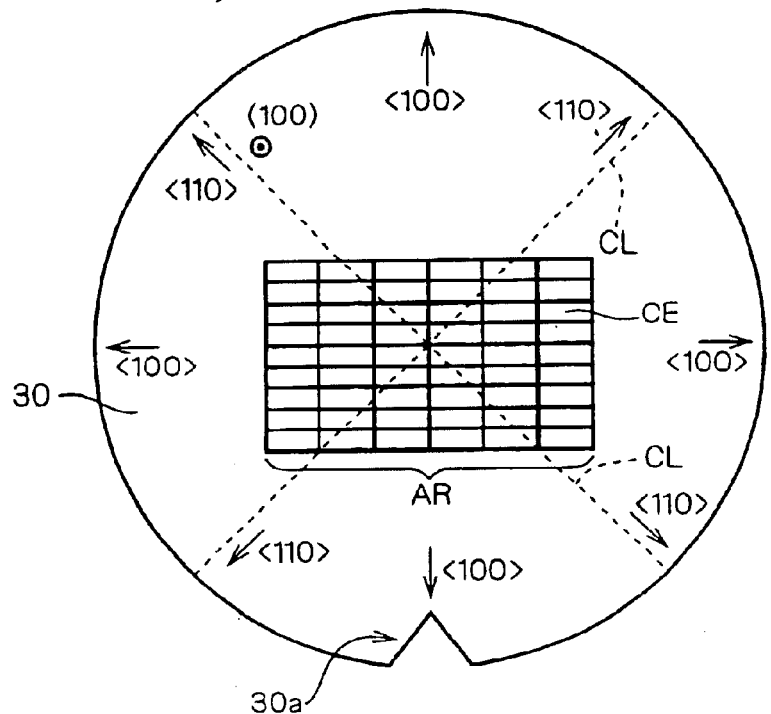
Figure 21:
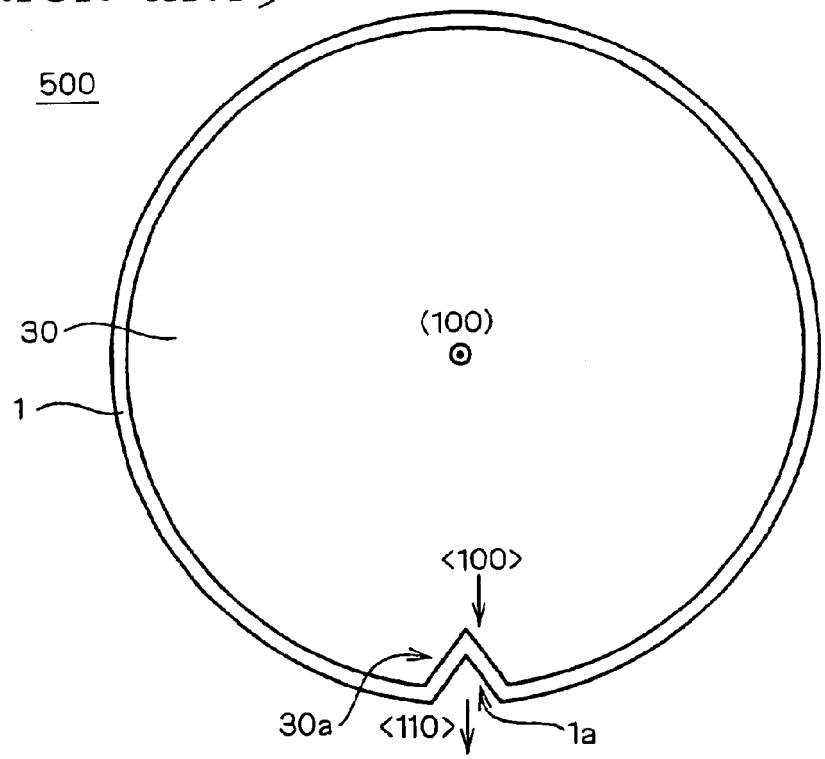

In the conventional SOI wafer shown in FIGS. 17 and 21, the wafer for the support substrate and the wafer for an SOI layer have been bonded with notches or orientation flats coincident with each other. In the present embodiment, however, the wafer 1 for the support substrate and the wafer for an SOI layer are bonded with the notches shifted from each other. Therefore, one of the two semiconductor wafers having notches provided in the same crystal orientation <100> is set to be the wafer for the support substrate and the other is set to be the wafer for an SOI layer to be a wafer for the device formation. Thus, the wafer for the support substrate and the wafer for the device formation can have different crystal orientations. Accordingly, it is not necessary to prepare two kinds of semiconductor wafers having different crystal orientations in which a notch or an orientation flat is to be provided.

When a semiconductor device including a device such as a MOS transistor TR1, a wiring for connecting the devices and the like is to be formed in the SOI layer 3, a conventional method is applied by using a notch 1a. Specifically, the MOS transistor TR1 can be provided such that a channel direction between a source and a drain is set in parallel with the crystal orientation <100>. In FIG. 1, designations S, D and G in the MOS transistor TR1 denote a source, a drain and a gate, respectively.

Moreover, the notches are shifted from each other by 45 degrees between the wafer 1 for the support substrate and the SOI layer 3. Therefore, a crystal surface {100} of the SOI layer 3 to be a part of the wafer for an SOI layer can be exposed through cleavage along a crystal surface {110} to be a cleavage plane of the wafer 1 for the support substrate occupying most of a wafer thickness. Consequently, a sectional structure of the semiconductor device including the MOS transistor TR1 can be seen perpendicularly to or in parallel with the direction of a channel or a gate. Therefore, it is possible to accurately carry out evaluation of a gate width or the like, for example.

Also in the case in which the notches are shifted from each other by 135 degrees between the wafer 1 for the support substrate and the SOI layer 3, the same effects as described above can be obtained.

In FIG. 1, the SOI layer 3 and the oxide film layer 2 have smaller diameters than the diameter of the wafer 1 for the support substrate. This implies that the wafer for the support substrate and the wafer for an SOI layer have the same diameters and the SOI layer 3 has a smaller diameter than that of the wafer 1 for the support substrate in a final configuration. Since a wafer surface is not flat in a peripheral portion of the wafer, the peripheral portion of the wafer is not bonded sufficiently. Therefore, in the case in which the SMART CUT method or the like is to be executed, for example, the peripheral portion of the wafer is also removed when the wafer for an SOI layer is to be removed. Consequently, the diameters of the SOI layer 3 and the oxide film layer 2 are smaller than the diameter of the wafer 1 for the support substrate.

Although the wafer for the support substrate and the wafer for an SOI layer which have the same diameters are generally bonded to each other, they may have different diameters. Moreover, while the SOI wafer is provided by forming the oxide film on the main surface of the wafer for an SOI layer and bonding the wafer for an SOI layer to the wafer for the support substrate in the present embodiment, it is also possible to employ an SOI wafer provided by forming an oxide film in the wafer for the support substrate and bonding the wafer for an SOI layer to the oxide film or an SOI wafer provided by forming oxide films on both the wafer for an SOI layer and the wafer for the support substrate and bonding the oxide films to each other.

The semiconductor wafer having the notch formed thereon has been taken as an example in the present embodiment. If a semiconductor wafer provided with an orientation flat or a nick indicative of a crystal orientation has the same structure as described above, it is possible to obtain the effects of the semiconductor wafer according to the present embodiment.

As a first variant of the present embodiment, it is possible to implement a semiconductor wafer in which printing is given by a laser to a portion in a main surface of a wafer for the support substrate which is exposed to an orientation flat of a wafer for an SOI layer such that the semiconductor wafer can be easily distinguished from other wafers. Furthermore, it is also possible to implement a semiconductor wafer in which an angle formed by a notch of the wafer for the support substrate and an orientation flat of the wafer for an SOI layer is set to 180 degrees and a printed portion can easily be seen from the outside of a case when the semiconductor wafers are accommodated in the case with notches aligned on the underside.

Figure 3:
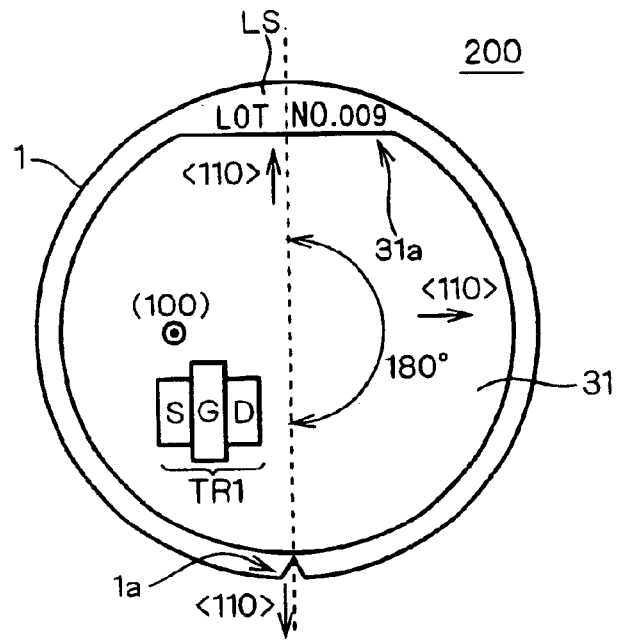
FIGS. 3 and 4 are top views showing a semiconductor wafer according to a first variant of the first embodiment.

FIG. 3 is a view showing a semiconductor wafer 200 according to the first variant. The semiconductor wafer 200 is an SOI wafer in the same manner as the semiconductor wafer 100, and is a (100) wafer in which a (100) plane is a main surface. Also in the SOI wafer 200, for example, an oxide film layer 2 is provided on one main surface of a wafer 1 for the support substrate formed of a silicon substrate and an SOI layer 31 is formed on the oxide film layer 2. The SOI layer 31 and the oxide film layer 2 are provided by forming an oxide film on a main surface of a wafer for an SOI layer to be the wafer for the device formation, bonding the wafer for an SOI layer to the wafer 1 for the support substrate and then removing a part thereof. Both the wafer 1 for the support substrate and the wafer for an SOI layer are the (100) wafers.

The SOI layer 31 is provided with a semiconductor device including a device such as a MOS transistor TR1, a wiring for connecting the devices and the like.

A notch 1a and an orientation flat 31a are formed in the wafer 1 for the support substrate and the SOI layer 31 in a direction of a crystal orientation <110>, respectively. In the semiconductor wafer 200, however, positions of the notch 1a and the orientation flat 31a are shifted by 180 degrees between the wafer 1 for the support substrate and the SOI layer 31. More specifically, as shown in FIG. 3, both the notch 1a of the wafer 1 for the support substrate and the orientation flat 31a of the SOI layer 31 are indicative of the same crystal orientation <110>, and the wafer 1 for the support substrate and the SOI layer 31 are bonded with the notch 1a and the orientation flat 31a shifted from each other by 180 degrees. Thus, the semiconductor wafer 200 is formed.

The wafer 1 for the support substrate and the SOI layer 31 are bonded to each other such that a part of the main surface of the wafer 1 for the support substrate is exposed to the orientation flat portion 31a of the SOI layer 31.

Furthermore, printing LS of "LOT NO. 009" is given by a laser to a portion in the main surface of the wafer 1 for the support substrate which is exposed to the orientation flat portion 31a. Consequently, the printing LS can be seen when the semiconductor wafer is observed from the (100) plane of the SOI layer 31, and the semiconductor wafer can easily be distinguished. Moreover, the portion in the main surface of the wafer 1 for the support substrate which is exposed to the orientation flat 31a can be utilized effectively as a printing space.

Moreover, the notch 1a of the wafer 1 for the support substrate and the orientation flat 31a of the SOI layer 31 form an angle of 180 degrees. Therefore, when a plurality of semiconductor wafers are accommodated in a case with the notches 1a aligned on the underside at a step of inspecting the semiconductor wafer or the like, the printing LS portion can easily be seen from the outside of the case so that the semiconductor wafers can readily be distinguished.

In the semiconductor wafer having an SOI structure, there is a problem in that the SOI layer is readily peeled by the influence of heating of the laser if the printing is to be given to a surface of the SOI layer by means of the laser. However, if the printing is given by the laser to the portion in the main surface of the wafer 1 for the support substrate which is exposed to the orientation flat portion 31a of the SOI layer 31 in place of the SOI layer as in the semiconductor wafer 200, there is less possibility that the SOI layer might be peeled.

While the notch 1a has been employed for the wafer 1 for the support substrate and the orientation flat 31a has been employed for the SOI layer 31 in the semiconductor wafer 200, the orientation flat may be provided in the wafer 1 for the support substrate and the notch may be provided in the SOI layer 31, or the orientation flat may be provided in both the wafer 1 for the support substrate and the SOI layer 31.

Figure 4:
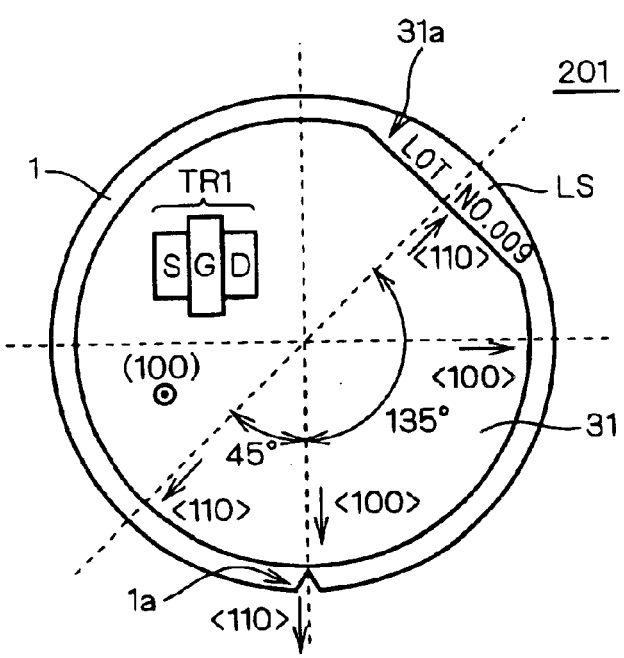

FIG. 4 shows a semiconductor wafer 201 in which the orientation flat 31a and the notch 1a are shifted from each other by 135 degrees, thereby producing the same effects as those of the semiconductor wafer 100. Also in this case, it is a matter of course that the printing LS may be given to the portion in the main surface of the wafer 1 for the support substrate which is exposed to the orientation flat portion 31a.

As a second variant of the present embodiment, moreover, it is also possible to implement a semiconductor wafer having a bulk structure in place of the SOI structure in which a crystal orientation is varied between the surface side of the wafer and an innermost part thereof.

In the case in which a channel direction of a MOS transistor is provided in parallel with a crystal orientation <100> in a (100) wafer, a simple rotation of the wafer by 45 degrees or 135 degrees hinders the development of a new device. This is true of a bulk wafer as well as the SOI wafer.

In the second variant, a wafer for the support substrate is bonded to a wafer for the device formation and a part of the wafer for the device formation is used as a device formation layer. Consequently, a bulk wafer having a crystal orientation varied between the surface side and the innermost part is formed.

FIG. 5 is a view showing a semiconductor wafer 300 according to the second variant. Moreover, FIG. 6 is a view showing a section taken along a cutting line Y—Y in FIG. 5. The semiconductor wafer 300 is a bulk wafer, and furthermore, is a (100) wafer having a (100) plane to be a main surface.

In the semiconductor wafer 300, for example, a device formation layer 32 is formed on one main surface of a wafer 11 for the support substrate formed of a silicon substrate. The device formation layer 32 is provided by bonding a wafer for the device formation formed of the silicon substrate to the wafer 11 for the support substrate and then removing a part thereof, for example. Both the wafer 11 for the support substrate and the wafer for the device formation are the (100) wafers. In the case of a wafer having a diameter of 20.32 cm, the wafer 11 for the support substrate may have a thickness T2 of approximately 700 µm and the device formation layer 32 may have a thickness T1 of approximately 0.1 to several µm, for example.

Notches 11a and 32a are formed in the wafer 11 for the support substrate and the device formation layer 32 in a direction of a crystal orientation <110>, respectively. Also in the semiconductor wafer 300, a position of the notch is shifted by 45 degrees between the wafer 11 for the support substrate and the device formation layer 32 in the same manner as in the semiconductor wafer 100. More specifically, as shown in FIG. 5, both the notch 11a of the wafer 11 for the support substrate and the notch 32a of the device formation layer 32 are indicative of the same crystal orientation <110> and the wafer 11 for the support substrate and the device formation layer 32 are bonded to each other with the notches shifted from each other by 45 degrees. Thus, the semiconductor wafer is formed.

According to the semiconductor wafer 300, the wafer for the support substrate and the wafer for the device formation which have the bulk structures are bonded with the crystal orientations shifted from each other. Therefore, it is possible to vary the crystal orientations in the wafer for the support substrate and the wafer for the device formation.

The wafer 11 for the support substrate and the wafer for the device formation are bonded with the notches shifted from each other. Therefore, one of two semiconductor wafers having notches provided in the same crystal orientation <100> is set to be the wafer for the support substrate and the other is set to be the wafer for the device formation. Thus, the wafer for the support substrate and the wafer for the device formation can have different crystal orientations. Accordingly, it is not necessary to prepare two kinds of semiconductor wafers having different crystal orientations in which a notch or an orientation flat is to be provided.

A semiconductor device including a device such as a MOS transistor TR1, a wiring for connecting the devices and the like is formed on the device formation layer 32. In the same manner as in the semiconductor wafer 100, the MOS transistor TR1 can be formed such that a channel direction between a source and a drain is set in parallel with the crystal orientation <100>. In the MOS transistor TR1, designations S, D and G denote a source, a drain and a gate, respectively.

Moreover, the notches are shifted from each other by 45 degrees between the wafer 11 for the support substrate and the device formation layer 32. Therefore, a crystal surface {100} of the device formation layer 32 to be a part of the wafer for the device formation can be exposed through cleavage along a crystal surface {110} to be a cleavage plane of the wafer 11 for the support substrate. The main surface of the device formation layer 32 is provided with the semiconductor device including the MOS transistor TR1 having a channel direction between a source and a drain in parallel with the direction of the crystal orientation <100>. Therefore, when the cleavage is carried out along the crystal surface {110} to be the cleavage plane of the wafer 11 for the support substrate, the crystal surface {100} of the device formation layer 32 is exposed. Consequently, a sectional structure of the semiconductor device including the MOS transistor TR1 can be seen perpendicularly to or in parallel with the direction of a channel or a gate. Therefore, it is possible to accurately carry out evaluation of a gate width or the like, for example.

Also in the case in which the notches are shifted from each other by 135 degrees between the wafer 11 for the support substrate and the device formation layer 32, the same effects as described above can be obtained.

Also in FIG. 5, the device formation layer 32 has a smaller diameter than that of the wafer 11 on the support substrate side for the same reason as that in the semiconductor wafer 100.

Although the wafer for the support substrate and the wafer for the device formation which have the same diameters are bonded to each other in the second variant, they may have different diameters.

While the semiconductor wafer having the notch formed thereon has been taken as an example in the second variant, a semiconductor wafer provided with an orientation flat or a notch indicative of a crystal orientation may be used. Furthermore, if the crystal orientation can be shifted accurately, two semiconductor wafers having neither the notch nor the orientation flat may be used for the wafer for the support substrate and the wafer for the device formation.

<Second Embodiment>

In the present embodiment, description will be given to a method of manufacturing a semiconductor wafer 300. The semiconductor wafer 300 can be manufactured by application of the SMART CUT method or the ELTRAN method.

Figure 7:
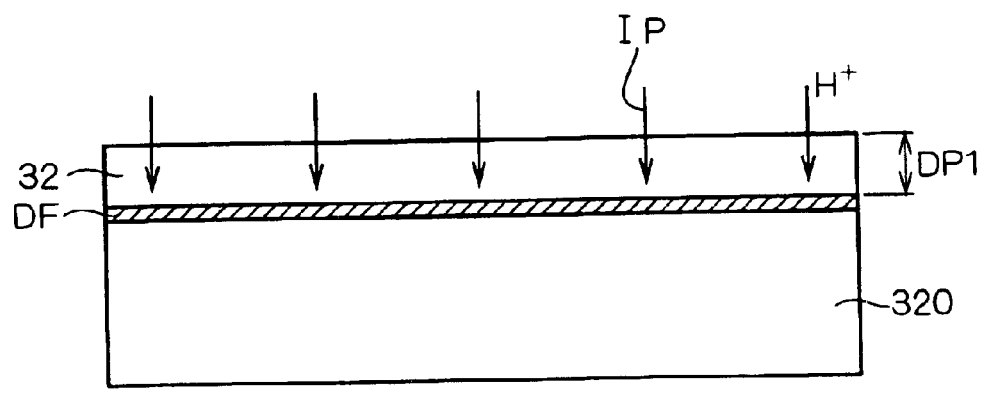

First of all, a manufacturing method applying the SMART CUT method will be described. As shown in FIG. 7, a wafer 320 for the device formation such as a silicon wafer is prepared and hydrogen ion implantation IP is carried out from a main surface to form a crystal defect layer DF in a position having a predetermined depth DP1 (a position corresponding to a thickness T1 of a device formation layer 32).

Figure 8:
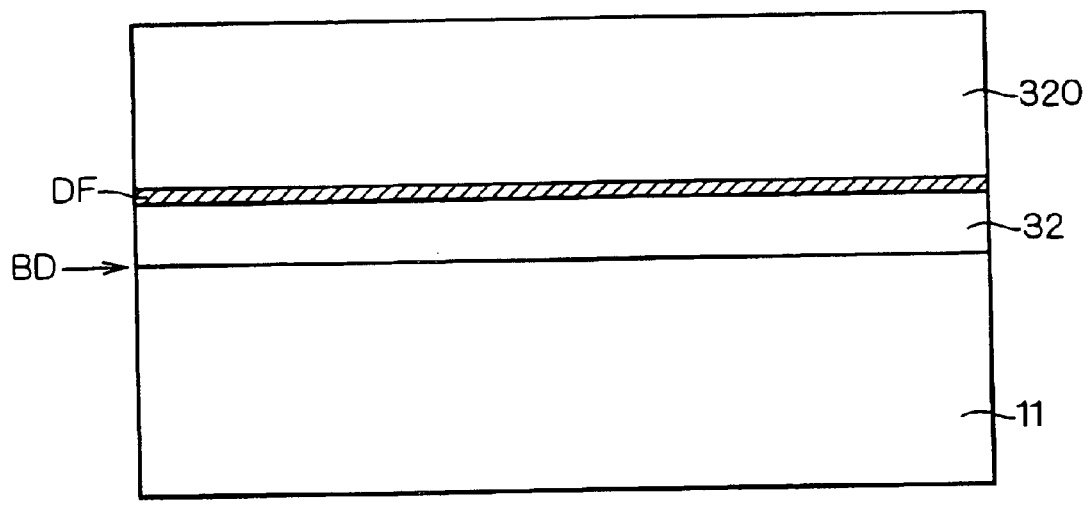

As shown in FIG. 8, next, a main surface of a portion to be the device formation layer 32 is bonded to that of a wafer 11 for the support substrate. In FIG. 8, a bonded face is indicated as BD. At this time, the wafer 11 for the support substrate and the wafer 320 for the device formation are bonded to each other with a shift having a predetermined angle (for example, 45 degrees)

Figure 9:
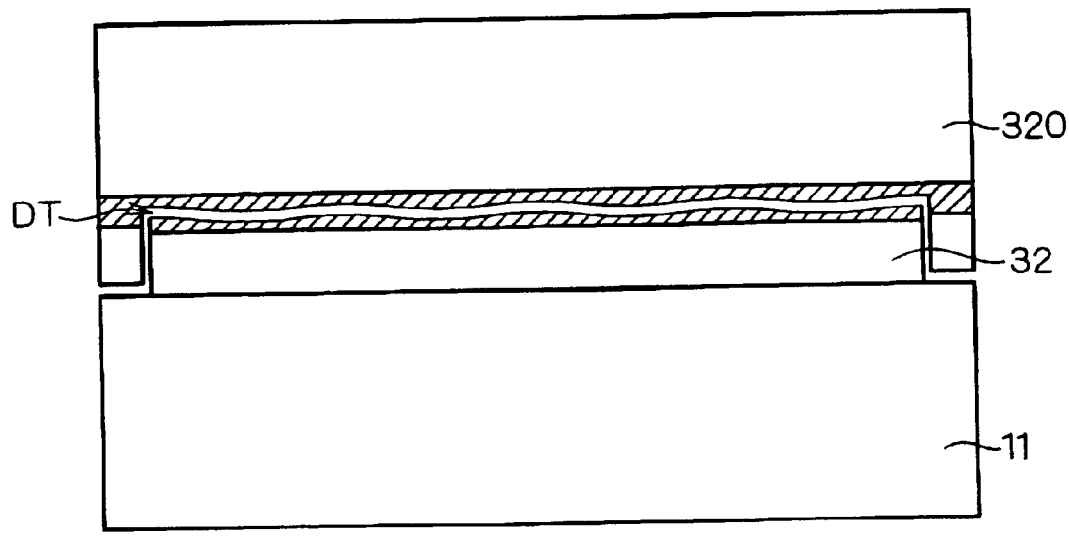

Next, a heat treatment is carried out to make the crystal defect layer DF fragile, and the wafer 320 for the device formation is divided in the crystal defect layer DF as shown in FIG. 9. At this time, a peripheral portion having a small bonding strength in the wafer 320 for the device formation is also removed. In FIG. 9, a divided face is indicated as DT.

Figure 10:
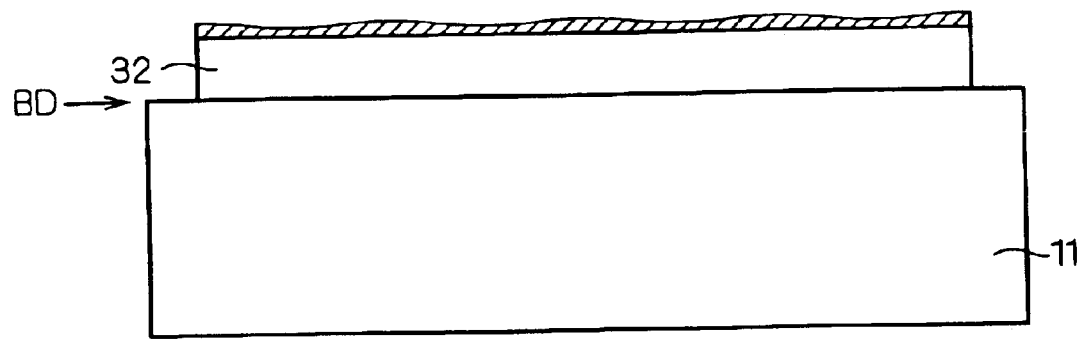

Then, the heat treatment is additionally carried out in a state shown in FIG. 10, thereby increasing a bonding strength of the device formation layer 32 and the wafer 11 for the support substrate. Thus, the surface of the device formation layer 32 is lightly polished to remove the remaining crystal defect layer. Consequently, the semiconductor wafer 300 shown in FIG. 6 can be obtained. It is preferable that the surface of the device formation layer 32 should be then oxidized sacrificially to be protected.

Figure 11:
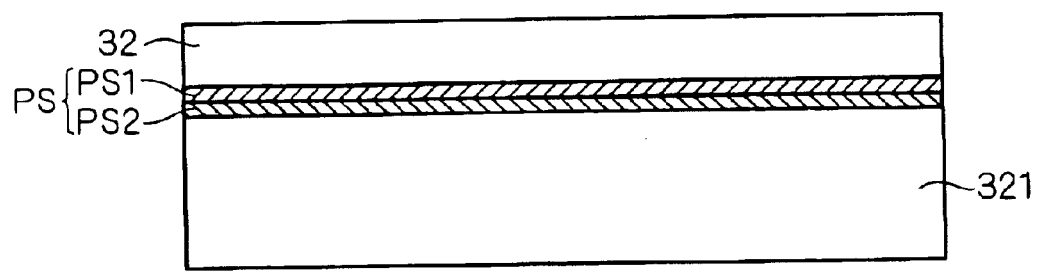

Next, a manufacturing method applying the ELTRAN method will be described. As an example, description will be given to the case in which the ELTRAN method using a water jet is applied. As shown in FIG. 11, first of all, a wafer 321 for the device formation such as a silicon wafer is prepared and is subjected to so-called anodization in an ionized solution containing $HF/C_2H_5OH$ to form a porous silicon-layer PS on a main surface thereof. The porous silicon layer PS comprises first layer PS1 and second layer PS2 that are different in porosity. A device formation layer 32 such as a silicon layer is formed on a surface of the porous silicon layer PS through epitaxial growth by CVD (Chemical Vapor Deposition) or the like.

Figure 12:
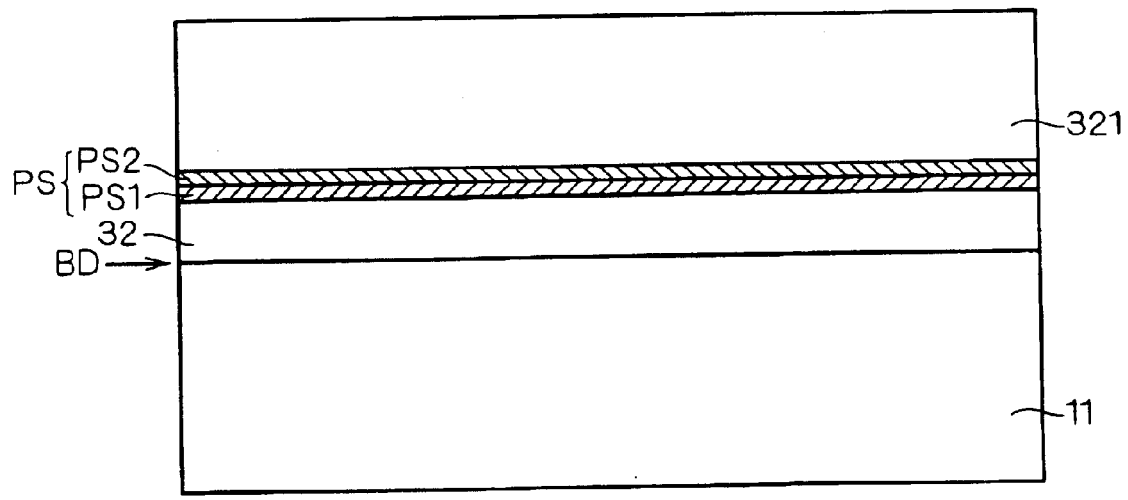

As shown in FIG. 12, next, a main surface of a portion to be the device formation layer 32 is bonded to that of the wafer 11 for the support substrate. In FIG. 11, a bonded face is indicated as BD. At this time, the wafer 11 for the support substrate and the wafer 321 for the device formation are bonded to each other with a shift having a predetermined angle (for example, 45 degrees).

As shown in FIG. 13, then, a water jet (high pressure water) is sprayed on the porous silicon layer PS to divide the wafer 321 for the device formation without damaging the wafer 321. At this time, an interface between the first layer PS1 and the second layer PS2 of the porous silicon layer PS becomes a divided face. Besides, a peripheral portion having a small bonding strength in the wafer 321 for the device formation is also removed. There may be cases where the division is completed without removing peripheral portions of the device formation layer 32 and the first layer PS1. In those cases, a structure shown in FIG. 14 can be obtained by etching the peripheral portions. In FIG. 13, the divided face is indicated as DT.

Then, the heat treatment is additionally carried out in a state shown in FIG. 14, thereby increasing a bonding strength of the device formation layer 32 and the wafer 11 for the support substrate. Thus, the surface of the device formation layer 32 is lightly polished to remove the remaining porous silicon layer. Consequently, the semiconductor wafer 300 shown in FIG. 6 can be obtained. It is preferable that the surface of the device formation layer 32 should be then oxidized sacrificially to be protected.

According to the method of manufacturing a semiconductor wafer described above, the semiconductor wafer 300 can be obtained.

It is not technically hard to bond the wafer 11 for the support substrate to the wafer 320 or 321 for the device formation with a shift having a predetermined angle. Under the circumstances, a device for detecting a position of a notch or an orientation flat in a wafer is applied to many semiconductor manufacturing apparatuses. Moreover, when an SOI wafer is to be formed, two wafers are bonded by using a wafer bonding device comprising two arms. Accordingly, it is easy to bond the two wafers with a shift having a predetermined angle by using the position detecting device and the wafer bonding device together.

In an existing semiconductor wafer, position accuracy for notch formation and orientation flat formation is approximately ±2 degrees. Accordingly, it is supposed that such an error is allowable when a crystal orientation is to be shifted by 45 degrees, for example, between the wafer 11 for the support substrate and the wafer 320 or 321 for the device formation.

In consideration of the foregoing, it is not necessary to strictly control the position of the notch or the orientation flat during the bonding and it is supposed that a simple bonding device using a wafer guide is fully applicable. An example of such a semiconductor wafer manufacturing apparatus will be described below.

Figure 15:
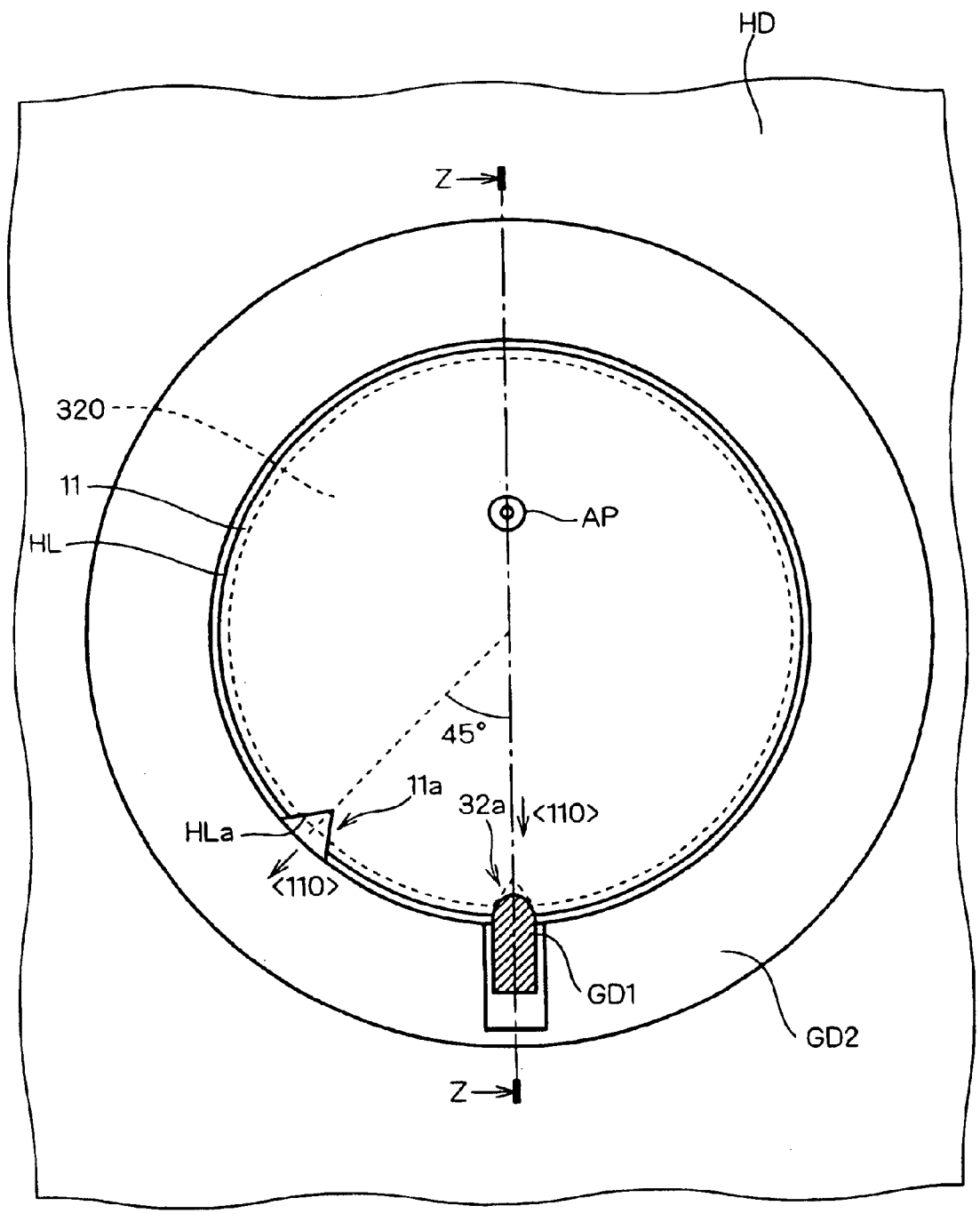
FIG. 15 is a top view showing a manufacturing apparatus to be used in the method of manufacturing a semiconductor wafer according to the second embodiment.
Figure 16:
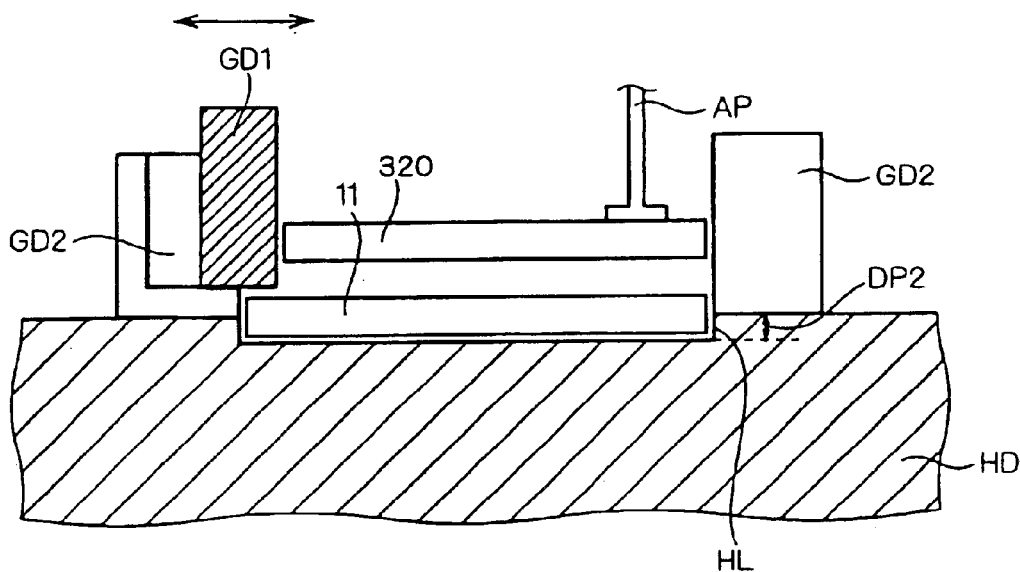
FIG. 16 is a sectional view showing the manufacturing apparatus to be used in the method of manufacturing a semiconductor wafer according to the second embodiment.

FIG. 15 shows a semiconductor wafer manufacturing apparatus capable of bonding the wafer 11 for the support substrate to the wafer 320 or 321 for the device formation with mutual notches 11a and 32a shifted by 45 degrees. Moreover, FIG. 16 is a view showing a section taken along a cutting line Z—Z in FIG. 15.

The manufacturing apparatus comprises a support base HD for supporting the wafer 11 for the support substrate, a wafer guide GD2 to be used as an alignment guide during the bonding of the wafer 320 or 321 for the device formation, and an air pin AP for sucking and holding a semiconductor wafer. FIGS. 15 and 16 show the case in which the wafer 320 for the device formation is applied to the manufacturing apparatus. In FIG. 15, moreover, the wafer 320 for the device formation is shown in a broken line and the wafer 11 for the support substrate which is positioned under the wafer 320 is illustrated clearly.

The support base HD is provided with a concave portion HL where the wafer 11 for the support substrate is to be mounted. As shown in FIG. 15, the fringe of the concave portion HL is provided with a convex portion HLa to abut on the notch 11a when the wafer 11 for the support substrate is mounted. It is preferable that a depth DP2 of the concave portion HL should be set to be smaller than a thickness of the wafer 11 for the support substrate.

Moreover, the wafer guide GD2 is a guide member provided on the support base HD surrounding the concave portion HL. The wafer guide GD2 is provided with a movable convex portion GD1 capable of abutting on the notch 32a of the wafer 320 or 321 for the device formation. The wafer guide GD2 is provided such that a position of the convex portion GD1 and that of the convex portion HLa formed in the concave portion HL of the support base HD are shifted from each other by 45 degrees.

In the manufacturing apparatus, the wafer 11 for the support substrate is first mounted in the concave portion HL of the support base HD and the convex portion GD1 is then protruded from the wafer guide GD2. Thereafter, the wafer 320 or 321 for the device formation is held with the air pin AP and the notch 32a is caused to abut on the convex portion GD1 and is brought down in this state. Thus, the wafer 320 or 321 for the device formation is bonded to the wafer 11 for the support substrate. Subsequently, the convex portion GD1 is accommodated in the wafer guide GD2 and the wafer 11 for the support substrate and the wafer 320 or 321 for the device formation thus bonded are pulled up and taken out by the air pin AP.

The depth DP2 of the concave portion HL is smaller than the thickness of the wafer 11 for the support substrate. Therefore, when the wafer 11 for the support substrate is mounted in the concave portion HL, it is slightly protruded from a surface of the support base HD. Consequently, when the convex portion GD1 is protruded from the wafer guide GD2, a bottom face of the convex portion GD1 can be less kept away from the surface of the wafer 11 for the support substrate. Thus, it is possible to bring down the wafer 320 or 321 for the device formation while reliably maintaining the state of abutment of the convex portion GD1 on the notch 32a.

By using the semiconductor wafer manufacturing apparatus, the position of the convex portion HLa formed on the fringe of the concave portion HL and that of the convex portion GD1 provided in the wafer guide GD2 are shifted from each other by a predetermined angle. Therefore, it is possible to bond the wafer for the support substrate to the wafer for the device formation with a shift having a predetermined angle. Thus, the semiconductor wafer 300 can be obtained. Moreover, the semiconductor wafers 100 and 200 can also be obtained in the same manner.

While the invention has been shown and described in detail, the foregoing description is in all aspects illustrative and not restrictive. It is therefore understood that numerous modifications and variations can be devised without departing from the scope of the invention.

What is claimed is:

1. A semiconductor wafer comprising:
   first and second semiconductor wafers having crystal orientation display sections to be nicks indicative of crystal orientations formed on fringes thereof,
   wherein said crystal orientation display sections are indicative of an identical crystal orientation in said first and second semiconductor wafers, and said first and second semiconductor wafers are bonded with said crystal orientation display sections shifted from each other.

2. The semiconductor wafer according to claim 1, wherein both of said first and second semiconductor wafers are (100) wafers in which (100) planes are main surfaces, and said crystal orientation display sections are shifted from each other by 45 degrees or 135 degrees.

3. The semiconductor wafer according to claim 2, wherein said first semiconductor wafer is a wafer for a support substrate and said second semiconductor wafer is a wafer for a device formation, and a main surface of said wafer for the device formation is provided with a semiconductor device including a MOS transistor in which a channel direction between a source and a drain is parallel with a direction of a crystal orientation <100>.

4. The semiconductor wafer according to claim 1, wherein said first semiconductor wafer is a wafer for a support substrate, said second semiconductor wafer is a wafer for an SQI layer, and an insulating film is formed on a main surface of at least one of said wafer for the support substrate and said wafer for the SQI layer.

5. A semiconductor wafer comprising:

a first semiconductor wafer; and a second semiconductor wafer having a crystal orientation display section to be a nick indicative of a crystal orientation formed on a fringe, wherein said first and second semiconductor wafers are bonded to each other such that a part of a main surface of said first semiconductor wafer is exposed by said crystal orientation display section of said second semiconductor wafer, and printing is provided to said part of said main surface of said first semiconductor wafer.

6. The semiconductor wafer according to claim 5, wherein a crystal orientation display section to be a nick indicative of a crystal orientation is also formed on a fringe of said first semiconductor wafer, and said crystal orientation display section of said first semiconductor wafer and said crystal orientation display section of said second semiconductor wafer form an angle of 180 degrees.

7. The semiconductor wafer according to claim 5, wherein said first semiconductor wafer is a wafer for a support substrate, said second semiconductor wafer is a wafer for an SOI layer, and an insulating film is formed on a main surface of at least one of said wafer for the support substrate and said wafer for the SQI layer.

8. A semiconductor wafer comprising:

first and second semiconductor wafers having no buried insulating layer, said first and second semiconductor wafers including main surfaces to which a semiconductor that is a material of bulk structures is exposed, wherein said main surfaces of said first and second semiconductor wafers are bonded with crystal orientations shifted from each other.

9. The semiconductor wafer according to claim 8, wherein both of said first and second semiconductor wafers are (100) wafers in which (100) planes are main surfaces, and said crystal orientations are shifted from each other by 45 degrees or 135 degrees.

10. The semiconductor wafer according to claim 9, wherein said first semiconductor wafer is a wafer for a support substrate and said second semiconductor wafer is a wafer for a device formation, and a main surface of said wafer for the device formation is provided with a semiconductor device including a MOS transistor in which a channel direction between a source and a drain is parallel with a direction of a crystal orientation <100>.

* * * * *